United States Patent [19]

Fiedor et al.

[11] 4,135,099
[45] Jan. 16, 1979

[54] HIGH ENERGY, SHORT DURATION PULSE SYSTEM

[75] Inventors: Richard J. Fiedor, Penn Hills; Maurice H. Hanes, Murrysville, both of Pa.

[73] Assignee: Westinghouse Electric Corp., Pittsburgh, Pa.

[21] Appl. No.: 833,624

[22] Filed: Sep. 15, 1977

[51] Int. Cl.² ............................................. G02B 27/00
[52] U.S. Cl. ..................................... 250/551; 307/312
[58] Field of Search ............. 361/54; 307/252 R, 311, 307/312; 250/551

[56] References Cited

U.S. PATENT DOCUMENTS 3,585,454  6/1971  Roberts ........................... 317/234 R
3,832,732  8/1974  Roberts ............................... 357/19

Primary Examiner—David C. Nelms
Assistant Examiner—Darwin R. Hostetter
Attorney, Agent, or Firm—W. G. Sutcliff

[57] ABSTRACT

A system for switching a high energy, short duration pulse from a high energy source to an impedance matched series load. A light activated semiconductor device having a rectifying junction is serially connected between the source and the load, and another light activated semiconductor device is connected in parallel across the load. A fast rise time laser light source sequentially activates the series connected device to initiate the energy pulse, and then actuates the device paralleled across the load to short circuit the load and terminate the energy pulse.

5 Claims, 2 Drawing Figures

HIGH ENERGY, SHORT DURATION PULSE SYSTEM

BACKGROUND OF THE INVENTION

The present invention relates to pulse forming systems, and more particularly high energy, short duration systems. Such systems find application with spark gaps, or in a variety of pulse networks.

Light activated semiconductive devices are well known in the art, ranging from light activated rectifying diodes to light activated thyristors. Such light activated semiconductive devices have been used with fast rise time pulse lasers to switch on very high currents in a few nanoseconds or less. It has not yet been possible to turn off such semiconductive devices in comparably short times, because the time required to turn off the device is related to the time required to sweep out current carriers from the semiconductive device, or for recombination to eliminate these current carriers.

A conventional way of protecting high voltage power supplies, or of delivering energy pulses from such sources is to use a "crowbar" parallel shunting circuit with a high power switching device such as a thyratron activated ignitron as the switch element. Of course, such prior art systems had relatively long turn-on times and resultant long pulse times.

Light activated semiconductive devices are well known in the art, as in U.S. Pat. Nos. 3,585,454 and 3,832,732. These devices can be rapidly activated with turn-on times largely limited by the rise time of the light source. Recently developed pulse lasers have rise times of several nanoseconds, with pulse widths of tens of nanoseconds, such as a YAG laser.

SUMMARY OF THE INVENTION

A system is detailed for switching a high energy, short duration pulse from a high energy source to an impedance matched series load. A light activated semiconductive device having a rectifying junction is serially connected between the high energy source and the load, and another light activated semiconductive device is connected in parallel across the load. A fast rise time laser light source is sequentially directed onto the serially connected device and then onto the parallel connected device, so that turn-on of the series device switches the high energy from the source to the load, while sequential turn-on of the parallel device short circuits the load and terminates the energy pulse.

DESCRIPTION OF THE PREFERRED EMBODIMENTS

Figure 1:
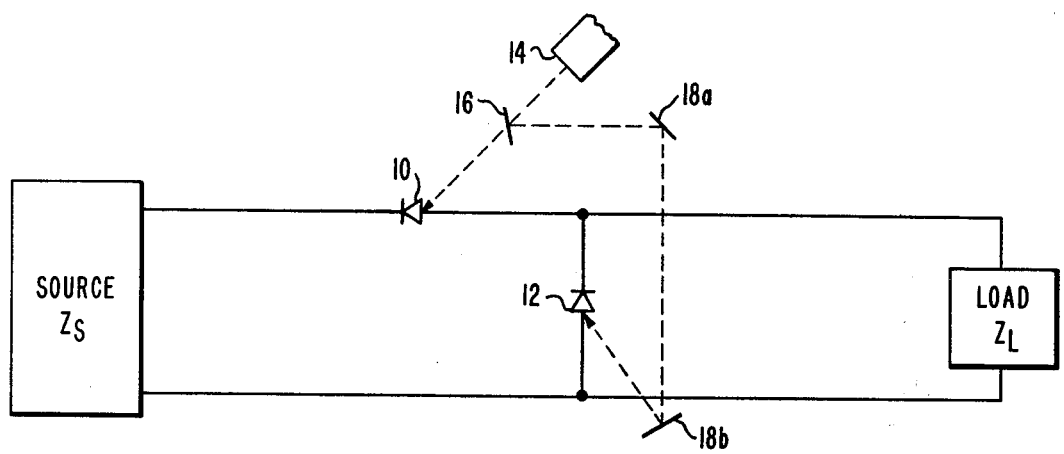
FIG. 1 is a schematic representation of the system of the present invention using high energy diodes as the semiconductive switching devices.
Figure 2:
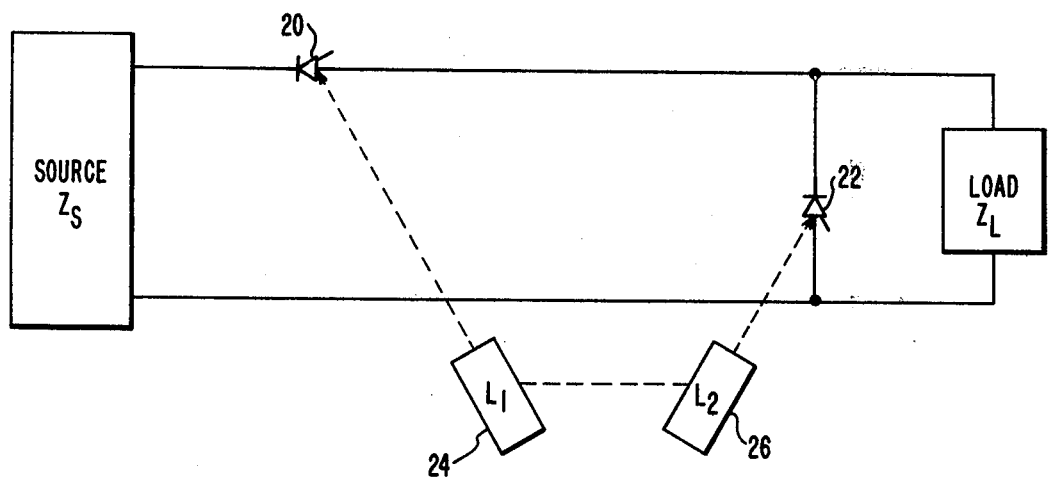
FIG. 2 is a schematic representation of the system of the present invention using high energy thyristors as the semiconductive devices, and separate sequentially operated laser light sources.

The invention is best understood by reference to the exemplary embodiments of FIGS. 1 and 2. In FIG. 1 a high energy source Zs is serially electrically connected to an impedance matched load Zl. A first light actuated semiconductive device 10 is connected in the series line. A second light actuated semiconductive device 12 is electrically connected in parallel across the load Zl. In this embodiment, both semiconductive devices are high voltage, high energy diodes with single rectifying junctions. The series connected first device 10 has an on impedance less than the source Zs, while the parallel second device 12 has an on impedance less than the load Zl.

A fast rise time laser light source 14 is disposed to direct its output laser light onto a beam splitter 16, with a portion of the laser light passing through beam splitter 16 and directed onto the series first semiconductive device 10. A portion of the laser light is reflected from the beam splitter 16 and from mirror 18 onto the parallel second semiconductive device. The path of this reflected laser light which is eventually directed onto the parallel second semiconductive device is longer than the travel path for the laser light which passes through the beam splitter and is directed onto the series first semiconductive device. It is this path length difference which gives rise to the sequential time difference between actuation of the first and second semiconductive devices.

Initially both semiconductive devices are connected in voltage blocking relationship. The laser light directed onto the series first semiconductive device creates current carriers therein turning the device on and current flows through the load. After the reflected laser light strikes the parallel second semiconductive device it turns on thereby short circuiting the load and causing current through the load to decrease rapidly. In this way short duration, high energy pulses of fast rise and fall time are produced. The pulse length is dependent on the optical path length difference, and in air, the pulse length will be approximately 3 nanoseconds per meter of path length difference.

A YAG pulse laser has been utilized in this system, with about a 6 nanosecond rise time, and a twenty nanosecond pulse duration.

In the embodiment of FIG. 2, a first thyristor 20 is serially connected between the source Zs and load Zl, with a second thyristor 22 connected in parallel across the load. The thyristors block voltage in both directions and are thus useable in systems where this is an advantage. Separate pulse laser sources 24 and 26 are used to respectively sequentially actuate thyristors 20 and 22 with the same effect as explained for the embodiment of FIG. 1. Laser source 24 is activated first to turn-on thyristor 20, and thereafter laser source 26 which is activated after a predetermined time delay turns on thyristor 22 to short circuit the load and terminate the energy pulse.

The embodiment using light actuated diodes is limited to relatively short duration pulse switching because such diodes can only pass electrical charge equal to the charge directly created in the diode by the light absorption. The second embodiment using light actuated thyristors can be used for longer pulse width applications, since such thyristors once turned on by means of the charge created by light absorption will continue to conduct for so long as the power source can supply current.

What we claim is:

1. A system for switching a high energy, short duration pulse from a high energy source to an impedance matched series load, comprising a first light activated semiconductive device having at least one rectifying junction and an on impedance less than the source, serially connected between the high energy source and the series load, a second light activated semiconductive device having at least one rectifying junction and an on impedance less than the load, which second light activated semiconductive device is shunted across the load, and a fast rise time laser light source with means for sequentially directing the laser light output onto the first and then the second semiconductive device, whereby turn-on of the first device switches the high energy from the source to the load, while sequential turn-on of the second device short circuits the load and terminates the energy pulse.

2. The system set forth in claim 1, wherein the first and second semiconductive devices are light activated rectifying diodes.

3. The system set forth in claim 1, wherein the first and second semiconductive devices are light activated thyristors.

4. The system set forth in claim 1, wherein a single laser light source is sequentially optically coupled to the first and second semiconductive devices by a beam splitter and a light reflective mirror, with a portion of the laser light passing through the beam splitter and activating the first semiconductive device, and a reflected portion of the laser light reflected from the beam splitter and the mirror to the second semiconductive device, with the light path for the reflected light which activates the second semiconductive device being greater than the light path for the transmitted light which activates the first semiconductive device, with the pulse length being determined by the optical path difference for the transmitted and reflected light.

5. The system set forth in claim 1, wherein separate laser light sources are optically coupled to the respective first and second semiconductive devices with the light output pulses from the separate laser light sources being synchronized to produce the desired pulse duration.

* * * * *